United States Patent
Murakami

(10) Patent No.: US 6,829,752 B2
(45) Date of Patent: Dec. 7, 2004

(54) DUTY ANALYSIS SYSTEM FOR A SEMICONDUCTOR INTEGRATED CIRCUIT AND DUTY ANALYSIS METHOD OF THE SAME

(75) Inventor: Hideaki Murakami, Round Rock, TX (US)

(73) Assignee: Kabushiki Kaisha Toshiba, Tokyo (JP)

( * ) Notice: Subject to any disclaimer, the term of this patent is extended or adjusted under 35 U.S.C. 154(b) by 52 days.

(21) Appl. No.: 10/259,500

(22) Filed: Sep. 30, 2002

(65) Prior Publication Data

US 2003/0126568 A1 Jul. 3, 2003

(30) Foreign Application Priority Data

Oct. 1, 2001 (JP) .................................... P2001-305706

(51) Int. Cl.[7] ............................................. G06F 17/50
(52) U.S. Cl. ............................................. 716/4; 716/18
(58) Field of Search ............................. 716/1, 4–5, 18; 703/14–15

(56) References Cited

U.S. PATENT DOCUMENTS

| | | | | |
|---|---|---|---|---|
| 5,446,676 A | * | 8/1995 | Huang et al. ................. | 703/19 |
| 5,598,344 A | * | 1/1997 | Dangelo et al. ............... | 716/18 |
| 5,623,418 A | * | 4/1997 | Rostoker et al. ................ | 716/1 |
| 5,727,187 A | * | 3/1998 | Lemche et al. ............... | 716/18 |
| 5,768,145 A | * | 6/1998 | Roethig ........................ | 703/14 |
| 6,152,612 A | | 11/2000 | Liao et al. | |
| 6,324,678 B1 | * | 11/2001 | Dangelo et al. ............... | 716/18 |
| 6,577,992 B1 | * | 6/2003 | Tcherniaev et al. ........... | 703/14 |

* cited by examiner

Primary Examiner—Vuthe Siek
Assistant Examiner—Paul Dinh

(57) ABSTRACT

A system for analyzing a monolithic integrated circuit includes a logic circuit simulator configured to obtain a cell duty of a primitive cell configuring a logic circuit by performing a logic simulation of the logic circuit based on a netlist of the logic circuit and input vectors for the logic circuit, an analog circuit simulator configured to obtain a transistor duty of a transistor that configures a primitive cell by performing an analog simulation of the primitive cell based on a netlist of the analog circuit of the primitive cell and input vectors for the primitive cell, and a synthesis module configured to obtain a synthesized duty of a transistor of the logic circuit by performing a synthesis of the cell and transistor duties.

16 Claims, 3 Drawing Sheets

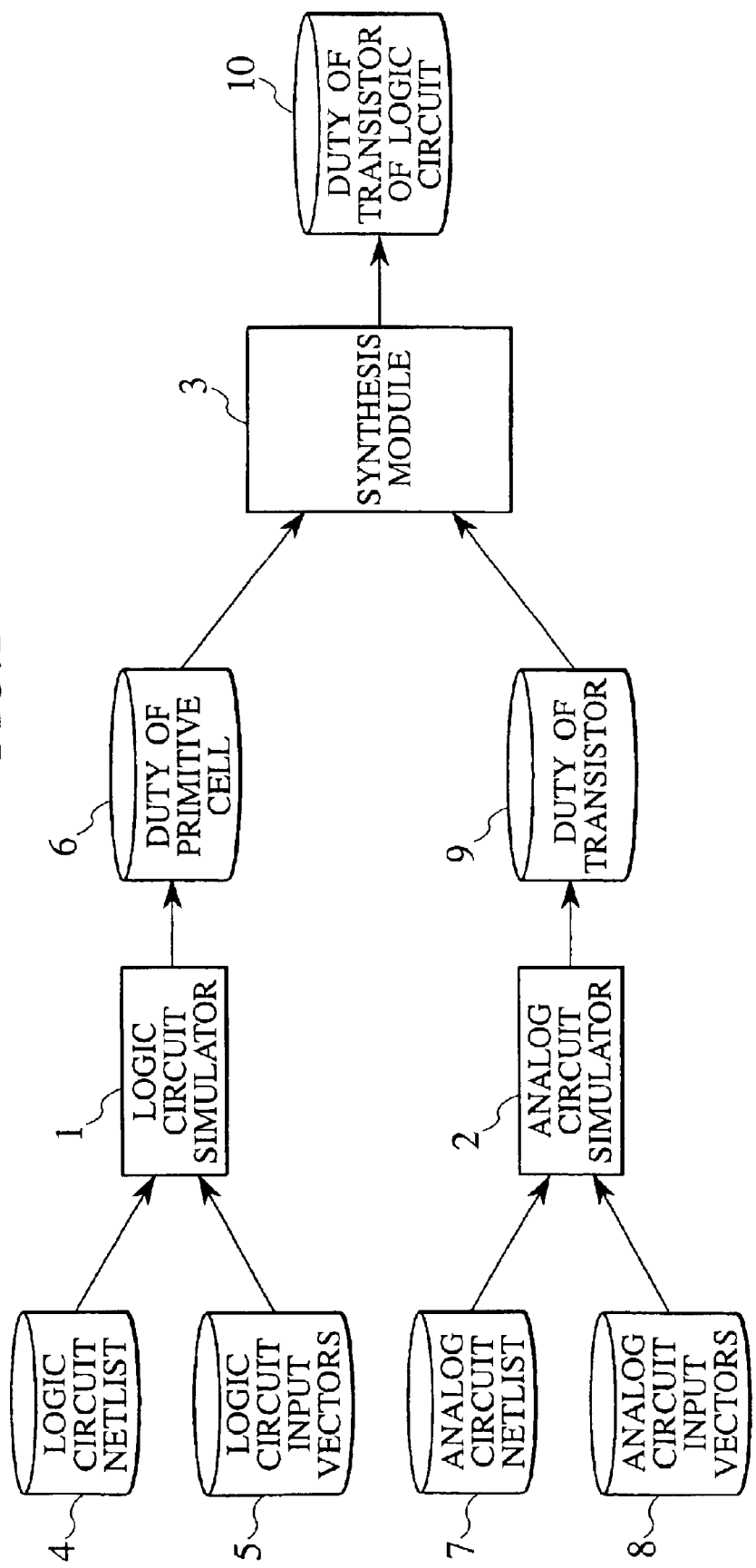

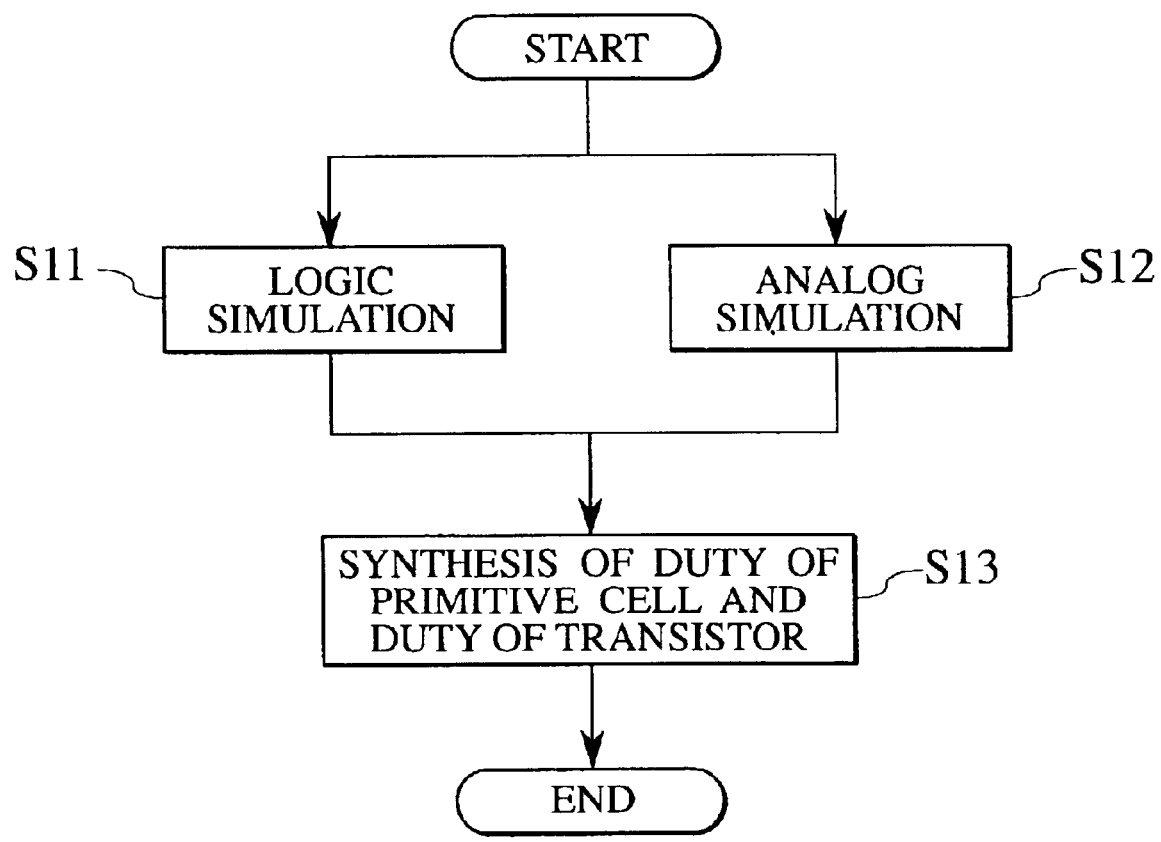

DUTY ANALYSIS SYSTEM FOR A SEMICONDUCTOR INTEGRATED CIRCUIT AND DUTY ANALYSIS METHOD OF THE SAME

CROSS REFERENCE TO RELATED APPLICATIONS

This application is based upon and claims the benefit of priority from the prior Japanese Patent Application P2001-305706 filed on Oct. 1, 2001; the entire contents of which are incorporated herein by reference.

BACKGROUND OF THE INVENTION

1. Field of the Invention

The present invention relates to an analysis system for a semiconductor integrated circuit and an analysis method of the same, which finds the duty of a transistor in a large-scale logic circuit using an analog circuit simulator and a logic circuit simulator.

2. Description of the Related Art

In the design stage of a semiconductor integrated circuit, there are many cases where the duty of a transistor—the element activation rate or the bias transition probability of the transistor—is required, with the duty of a transistor mainly being required when analyzing problems in reliability. Here, the duty of the transistor means the percentage which the transistor is at a certain predetermined bias status within a certain specified period of time. The specified bias status is arbitrarily defined in accordance with the details that are to be analyzed.

Conventionally, to find the duty of the transistor, there is a method whereby the duty of the transistor is obtained by performing a simulation using an analog circuit simulator such as that typified by HSPICE or the like, and then by analyzing the circuit dynamically. Although this method may be applicable for a circuit having approximately 40,000 to 50,000 transistors, its application is extremely difficult in large-scale logic circuits having 10 million gates per chip such as a System On Chip (SOC).

In addition, conventionally, a logic circuit simulator such as that typified by Verilog-XL or the like is used for logic circuit analysis. This simulator is able to analyze the logic functions of a large-scale logic circuit. Nevertheless, while the logic circuit simulator may be capable of finding the duty of each structural element configuring a logic circuit, for example a primitive cell such as a NAND gate or NOR gate, it is not capable of obtaining the duty of a transistor, for example, a MOS field effect transistor (MOSFET) configuring that primitive gate.

As described above, it is extremely difficult for a conventional analog circuit simulator to obtain the duty of a transistor in a large-scale logic circuit. Furthermore, a conventional logic circuit simulator is capable of analyzing a large-scale logic circuit, but cannot obtain the duty of a transistor. In other words, a problem lies in the fact that neither the analog circuit simulator nor the logic circuit simulator is capable of obtaining the duty of a transistor in a large-scale logic circuit.

SUMMARY OF THE INVENTION

An aspect of the present invention provides a system for analyzing a monolithic integrated circuit. The system includes: a) a logic circuit simulator configured to obtain the duty of a primitive cell that configures a logic circuit to be analyzed by performing a logic simulation of the logic circuit based on a netlist of the logic circuit and input vectors for the logic circuit; b) an analog circuit simulator configured to obtain the duty of a transistor that configures a primitive cell by performing an analog simulation of the primitive cell based on a netlist of the analog circuit of the primitive cell and input vectors for the primitive cell; and c) a synthesis module configured to obtain the duty of a transistor of the logic circuit by performing a synthesis of the duty of the primitive cell and the duty of the transistor.

Another aspect of the present invention provides a method for analyzing a monolithic integrated circuit. The method includes: a) obtaining the duty of a primitive cell, which configures a logic circuit to be analyzed, by performing a logic simulation of the logic circuit based on a netlist of the logic circuit and input vectors for the logic circuit; b) obtaining the duty of a transistor, which configures the primitive cell, by performing an analog simulation of the primitive cell based on a netlist of an analog circuit in the primitive cell and input vectors for the primitive cell; and c) obtaining the duty of a transistor of the logic circuit by performing a synthesis of the duty of the primitive cell and the duty of the transistor.

BRIEF DESCRIPTION OF THE DRAWINGS

FIG. 1 is a diagram showing a configuration of a semiconductor integrated circuit analysis system according to an embodiment of the present invention;

FIG. 2 is a flowchart of the semiconductor integrated circuit analysis method according to an embodiment of the present invention;

DETAILED DESCRIPTION OF THE INVENTION

Figure 3A:
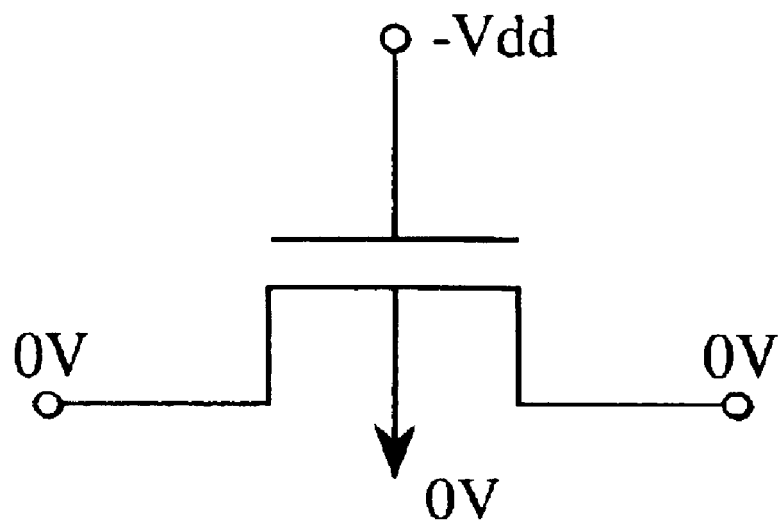
FIG. 3A is a diagram showing the bias status of a p-channel MOSFET during BT stress analysis.

Next, embodiments of the present invention are described while referencing the drawings. The same or similar reference numerals are used for the same or similar portions in the following description of the drawings. However, the drawings are schematic and it should be noted that that the scale of each measurement may be different from those in actuality.

Semiconductor Integrated Circuit Analysis System

As shown in FIG. 1, a semiconductor integrated circuit analysis system according to an embodiment of the present invention includes a logic circuit simulator 1, analog circuit simulator 2 and synthesis module 3.

The logic circuit simulator 1 obtains cell duties (the element activation rates) 6 of the respective primitive cells of a logic circuit by performing a logic simulation of a logic circuit based on logic circuit input vectors 5 input during analysis and a netlist 4 of the SOC level large-scale logic circuit to be analyzed. More specifically, the logic circuit simulator 1 speculates approximately what percentage of the input signal status is assigned to a primitive cell during a unit cycle. Here, "a unit cycle" refers to a designated time period decided by the designer(s), necessary for the input waveform required for the duty analysis.

Suppose that, to a primitive cell, for example, to a two-input NAND gate four combinations of binary input (00, 01, 10, 11) are applied, in the bias temperature (BT) stress analysis and the time dependent dielectric breakdown (TDDB) analysis, the cell duty of the primitive cell 6 is defined as the percentage of the period for respective input signals are applied during the unit cycle. Furthermore, in the hot carrier (HC) analysis, the cell duty 6 of the primitive cell is defined as the probability that an input status will change. Finding the length of time at each status is sufficient for BT stress analysis and TDDB analysis whereas the rate (percentage) at which each input status transition occurs is important for HC analysis. For example, in a two-input NAND gate, the four combinations of binary input (00, 01, 10, 11) may be as follows: (00 to 01) 10%, (00 to 10) 15%, (00 to 11) 5%, and (01 to 00) 10%.

The analog circuit simulator 2 performs an analog simulation of an analog circuit based on a netlist 7 of the analog circuit, which shows the circuit structure of a primitive cell in the large-scale logic circuit to be analyzed. And analog circuit input vectors 8, which bring about a certain specified bias status in transistors configuring the primitive cell, are input during analysis. Analog simulation is carried out on a primitive cell that configures the logic circuit. The transistor duties 9 of respective transistors configuring the primitive cell are obtained through the results of this analog simulation. In other words, the percentages of time the respective transistors are at a certain specified bias status during a unit cycle are obtained. This specified bias status is decided arbitrarily in accordance with the details of the analysis, for example, the BT stress analysis, TDDB analysis, or hot carrier analysis.

The synthesis module 3 obtains the synthesized duty 10 of transistors at the overall large-scale circuit level by performing a synthesis of the cell duty 6 of the primitive cell obtained using the logic circuit simulator 1 and the transistor duty 9 of the transistors obtained using the analog circuit simulator 2. More specifically, the synthesis module 3 correlates the cell duty 6 of each primitive cell of the overall circuit obtained using the logic circuit simulator 1 with the transistor duties 9 of the respective transistors of the corresponding primitive cell obtained using the analog circuit simulator 2. The synthesis module 3 then calculates the product of the transistor duty when at the specified bias status set for the transistors times the cell duty when input is applied in order to cause the specified bias to be set for the transistors, and outputs the value of this product as the synthesized duty 10 at the overall large-scale circuit level.

Let, for example, "a" be the transistor duty ratio obtained by the analog circuit simulator 2 where, for example, a transistor Ti of a primitive cell A at in the set specified bias status during a unit cycle. Meanwhile, let, for example, "b" be the cell duty of the primitive cell A obtained by the logic circuit simulator 1 when input is applied in order to cause the specified bias status to be set for the transistor T1. In this case, the product of the respective duties (a×b) is obtained using the synthesis module 3, and the value of the product (a×b) is applied as the synthesized transistor duty.

With the analysis system of the semiconductor integrated circuit according to this embodiment, the duty cell 6 of each primitive cell is obtained by the logic circuit simulator 1, and the transistor duties 9 of respective transistors configuring a primitive cell are obtained by the analog circuit simulator 2. The respective obtained cell duty 6 and transistor duties 9 are then synthesized to ultimately obtain the duty synthesized 10 of the respective transistors at the overall circuit level, making it possible to easily obtain the duties of the respective transistors in an extremely large-scale circuit such as SOC. Since there always exists a critical path in a circuit, which is a circuit path that has timing constraints, the designer(s) may be allowed decide upon which path to focus. By performing this analysis solely on these selected paths, inspection having favorable design efficiency becomes possible, enabling easier analysis of transistor reliability in the circuit design of the large-scale circuit.

Analysis Method for a Semiconductor Integrated Circuit

Next, an analysis method for a semiconductor integrated circuit according to an embodiment of the present invention is described while referencing FIG. 1 and FIG. 2.

(a) In step S11, logic circuit input vectors 5 to be input during analysis and a netlist 4 of a SOC level large-scale logic circuit to be analyzed are input. In addition, a logic circuit simulator 1 obtains the cell duty (the element activation rate) 6 of each primitive cell of the logic circuit by performing a logical simulation of a logic circuit based on the logic circuit netlist 4 and the logic circuit input vectors 5. The cell duty 6 of each primitive cell obtained using the logic circuit simulator 1 is transferred to a synthesis module 3.

(b) Meanwhile, in step S12, an analog circuit simulator 2 receives a analog circuit netlist 7 showing a circuit structure of a primitive cell in the large-scale circuit to become the analysis target and analog circuit inputs vectors 8 that bring about a certain specified status in transistors configuring the primitive cell and are input during analysis. In addition, the analog circuit simulator 2 obtains the transistor duties 9 of the respective transistors configuring the primitive cell by performing an analog simulation of the analog circuit based on the analog circuit netlist 7 and the analog circuit input vectors 8. The transistor duty obtained with the analog circuit simulator 2 is output to the synthesis module 3.

(c) Next, in step S13, the synthesis module 3 obtains the synthesized duty 10 at the overall large-scale logic circuit level by performing a synthesis of the cell duty 6 of the primitive cell obtained with the logic circuit simulator 1 in step S11 and the transistor duty 9 of the transistors obtained with the analog circuit simulator 2 in step S12.

According to the analysis method for a semiconductor integrated circuit of the embodiment of the present invention, the cell duty 6 of each primitive cell is obtained by the logic circuit simulator 1, and the transistor duties 9 of the respective transistors configuring the primitive cell are obtained by the analog circuit simulator 2. The respective obtained cell duty 6 and transistor duties 9 are synthesized to ultimately obtain the synthesized duty 10 of the respective transistors at the overall circuit level, making it possible to easily obtain the duties of the transistors in the extremely large-scale circuit such as SOC.

Hot Carrier Analysis

Next, the case where the semiconductor integrated circuit analysis system a according to an embodiment of the present invention is applied to hot carrier analysis of a MOSFET is described.

Conventionally, a tool that can handle the problem of a hot carrier in a MOSFET, for example, a tool called "BERT" is known as a tool that uses analog circuit simulation. In addition, a tool named "GLACIER", for example, is known as a tool that uses logic circuit simulation.

In order to analyze the problem of the hot carrier of the MOSFET correctly with these tools, the extent to which the MOSFET is in a bias status where the injection of a hot carrier may be likely to occur during operation of the circuit must be estimated correctly. However, with the analog circuit simulator there is a limit to the circuit scale capable of being analyzed, and the logic circuit simulator has not been capable of handling the duty at transistor level.

Therefore, the specified transistor bias status is set to a bias status where hot carrier injection is likely to occur. More specifically, a bias status where a transistor may be deteriorated by a hot carrier, and change in threshold value ($V_T$) and/or deterioration of conductance are likely to occur is set. For example, a bias status where $V_{GS}$ (voltage between gate and source) $>V_T$ and $V_{DS}$ (voltage between drain and source)$\geq V_{GS}$ is set. The semiconductor integrated circuit analysis system according to an embodiment of the present invention is implemented with such bias status settings.

With the hot carrier analysis using the semiconductor integrated circuit analysis system according to an embodiment of the present invention, it is possible to obtain the duty of a transistor in an SOC level large-scale circuit during actual circuit operation, which is necessary for hot carrier reliability analysis.

BT Stress Analysis

Next, the case where the semiconductor integrated circuit analysis system according to the embodiment of the present invention is applied to BT stress analysis of the MOSFET is described.

Figure 3B:
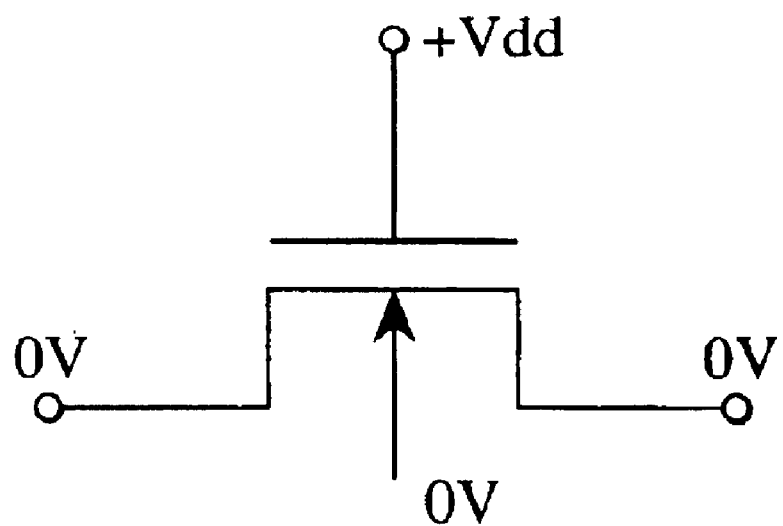
FIG. 3B is a diagram showing the bias status of an n-channel MOSFET during BT stress analysis.

As shown in FIGS. 3A and 3B, in order to make the semiconductor integrated circuit analysis system shown in FIG. 1 applicable to BT stress analysis, a specified transistor bias status is set to a bias status where BT stress may occur in a MOSFET. Namely, in the case of a p-channel MOSFET, as shown in FIG. 3A, the gate potential is set at $-V_{dd}$ ($V_{dd}$=power supply voltage), and the source potential, the drain potential and the substrate potential are respectively set at 0 V. In the case of an n-channel MOSFET, as illustrated in FIG. 3B, the gate potential is set at $+V_{dd}$, and the source potential, the drain potential and the substrate potential are respectively set at 0 V. The semiconductor integrated circuit analysis system according to this embodiment may be implemented with such bias settings.

With the BT stress analysis using the semiconductor integrated circuit analysis system according to an embodiment of the present invention, it is possible to obtain the duty of a transistor in an SOC level large-scale circuit during actual circuit operation, which is necessary for BT stress reliability analysis.

TDDB Analysis

Next, the case where the semiconductor integrated circuit analysis system according to an embodiment of the present invention is applied to TDDB analysis of the MOSFET is described.

The TDDB characteristics of a MOSFET are obtained as a function of the surface area of the gate oxide film and the applied voltage to the gate terminal. Accordingly, in order to make the semiconductor integrated circuit analysis system according to the embodiment shown in FIG. 1 applicable to TDDB analysis, the specified transistor bias status is set to the bias status where a gate voltage equal to or greater than the power supply voltage is applied to the gate terminal during a unit cycle. The semiconductor integrated circuit analysis system according to an embodiment of the present invention is implemented with such settings.

With the TDDB analysis using the semiconductor integrated circuit analysis system according to an embodiment of the present invention, it is possible to obtain the duty of a transistor in an SOC level large-scale circuit during actual circuit operation, which is required for TDDB reliability analysis, from the area of the gate oxide film obtained from transistor layout data and the results of analysis system implementation.

As described above, with the semiconductor integrated circuit analysis system and the analysis method of the same according to an embodiment of the present invention, since the duty of a transistor at the overall circuit level may be obtained through the synthesis of the cell duty of a primitive cell obtained by the logic circuit simulator and the transistor duty of the transistor configuring the primitive cell obtained by the analog circuit simulator, the synthesized duty of a transistor in a large-scale logic circuit may be easily obtained.

In the preceding, the present invention has been described in detail by means of embodiments; however, it will become clear to those skilled in the art that the present invention is not limited to the embodiments described in this application. For example, the above was described using a MOSFET, but a junction type FET, Schottky gate FET (MESFET), high electron mobility transistor (HEMT), bipolar transistor (BJT), or static induction transistor (SIT) may be used as well.

The apparatus of the present invention may be implemented with various corrections and modifications without falling outside of the spirit and scope of the present invention as laid out by the patent claims. Accordingly, the description included in this application is intended to be an exemplary description, and is not meant to be construed as limiting the present invention in any manner.

What is claimed is:

1. A system for analyzing a monolithic integrated circuit, comprising:
   a logic circuit simulator configured to obtain a cell duty of a primitive cell configuring a logic circuit by performing a logic simulation of the logic circuit based on a netlist of the logic circuit and input vectors for the logic circuit;
   an analog circuit simulator configured to obtain a transistor duty of a transistor configuring the primitive cell by performing an analog simulation of the primitive cell based on a netlist in the analog circuit of the primitive cell and input vectors for the primitive cell; and
   a synthesis module configured to obtain a synthesized duty of the transistor of the logic circuit by performing a synthesis of the cell and transistor,
   wherein the cell duty corresponds to a percentage of a period that an input signal is applied to said cell during a designated unit cycle and defined as a probability that an input status will change and the transistor duty corresponds to a percentage of time said transistor is at a certain specified bias status during said unit cycle.

2. The system of claim 1, wherein the synthesis by the synthesis module calculates the product of the transistor duty when at a specified bias status set for the transistor and the cell duty of the primitive cell that is applied an input to cause the specified bias status to be set.

3. The system of claim 2, wherein the specified bias status for the transistor is set to a bias status where the injection of a hot carrier occurs in the transistor.

4. The system of claim 3, wherein in the transistor, the voltage between the gate and the source is set to be larger than a threshold value, and the voltage between the drain and the source is set to be equal to or greater than that between the gate and the source.

5. The system of claim 2, wherein the specified bias status of the transistor is set to a bias status where BT stress occurs in the transistor.

6. The system of claim 5, wherein if the transistor is a p-channel MOSFET, the gate potential is set at a negative power supply voltage, and the source potential, drain potential and substrate potential are respectively set at 0 V.

7. The system of claim 5, wherein the transistor is an n-channel MOSFET, the gate potential is set at a positive power supply voltage, and the source potential, drain potential and substrate potential are respectively set at 0 V.

8. The system of claim 2, wherein in the transistor, the gate potential is set to be equal to or greater than the power supply voltage.

9. A method for analyzing a monolithic integrated circuit, comprising:

obtaining a cell duty of a primitive cell configuring a logic circuit by performing a logic simulation of the logic circuit based on a netlist of the logic circuit and input vectors for the logic circuit;

obtaining a transistor duty of a transistor configuring the primitive cell, by performing an analog simulation of the primitive cell based on a netlist of an analog circuit in the primitive cell and input vectors for the primitive cell; and obtaining a synthesized duty of a transistor of the logic circuit by performing a synthesis of the cell and transistor, wherein the cell duty corresponds to a percentage of a period that an input signal is applied to said cell during a designated unit cycle and defined as a probability that an input status will change and the transistor duty corresponds to a percentage of time said transistor is at a certain specified bias status during said unit cycle.

10. The method of claim 9, wherein the synthesis is configured to calculate the product of the transistor duty in a specified bias status set for the transistor and the cell duty of a primitive cell that is applied an input to cause the specified bias status.

11. The method of claim 10, wherein the specified bias status of the transistor is set to a bias status where the injection of a hot carrier occurs in the transistor.

12. The method of claim 11, wherein in the transistor, the voltage between the gate and the source is set to be larger than a threshold value, and voltage between the drain and the source is set to be equal to or greater than that between the gate and the source.

13. The method of claim 10, wherein the specified bias status of the transistor is set to a bias status where BT stress may occur in the transistor.

14. The method of claim 13, wherein the transistor is a p-channel MOSFET, the gate potential is set at a negative power supply voltage, and the source potential, drain potential and substrate potential are respectively set at 0 V.

15. The method of claim 13, wherein the transistor is an n-channel MOSFET, the gate potential is set at a positive power supply voltage, and the source potential, drain potential and substrate potential are respectively set at 0 V.

16. The method of claim 10, wherein in the transistor, the gate potential is set larger than power supply voltage.

* * * * *